(12) United States Patent
Liu

(10) Patent No.: US 12,336,160 B2
(45) Date of Patent: Jun. 17, 2025

(54) STATIC RANDOM ACCESS MEMORY CELL AND METHOD FOR FORMING SAME

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 449 days.

(21) Appl. No.: 17/836,122

(22) Filed: Jun. 9, 2022

(65) Prior Publication Data

US 2023/0113858 A1    Apr. 13, 2023

Related U.S. Application Data

(63) Continuation of application No. PCT/CN2021/137453, filed on Dec. 13, 2021.

(30) Foreign Application Priority Data

Oct. 8, 2021  (CN) .......................... 202111172987.1

(51) Int. Cl.
*H01L 27/11*   (2006.01)
*H10B 10/00*   (2023.01)
*H10D 64/27*   (2025.01)

(52) U.S. Cl.
CPC ........... *H10B 10/12* (2023.02); *H10D 64/513* (2025.01)

(58) Field of Classification Search
CPC ... H10B 10/12; H01L 29/4236; H10D 64/513
See application file for complete search history.

(56) References Cited

U.S. PATENT DOCUMENTS

| 6,287,909 | B1 | 9/2001 | Jen et al. |
| 10,741,564 | B2 | 8/2020 | Lee et al. |
| 2006/0019488 | A1 | 1/2006 | Liaw |
| 2010/0072545 | A1* | 3/2010 | Ryu ............... H01L 21/28211 257/334 |

(Continued)

FOREIGN PATENT DOCUMENTS

| CN | 100568512 C | 12/2009 |
| CN | 101714550 A | 5/2010 |

(Continued)

*Primary Examiner* — Ermias T Woldegeorgis
(74) *Attorney, Agent, or Firm* — Kilpatrick Townsend & Stockton LLP

(57) ABSTRACT

A static random access memory cell and a method for forming the same are provided. The method for forming a memory cell includes: providing a base; in which the base at least includes a substrate and an active area formed in the substrate; forming trenches extending in a first direction and arranged in a second direction in the active area; forming second gate structures extending in the first direction in the trenches; trimming the second gate structures in the second direction to form first gate structures; in which in a memory including static random access memory cells, every two rows of the first gate structures and the first gate structures separated by two rows have same opening positions; forming recessed channel array transistors based on the first gate structures; forming a static random access memory cell with six transistors based on the recessed channel array transistors.

13 Claims, 26 Drawing Sheets

(56) References Cited

U.S. PATENT DOCUMENTS

| | | | |
|---|---|---|---|
| 2011/0018057 A1* | 1/2011 | Kim | H10D 64/513 438/270 |
| 2015/0194431 A1 | 7/2015 | Hu | |
| 2017/0194330 A1 | 7/2017 | Lee et al. | |
| 2020/0185393 A1 | 6/2020 | Lee et al. | |
| 2020/0286897 A1* | 9/2020 | Panda | H10D 64/513 |

FOREIGN PATENT DOCUMENTS

| | | | | |
|---|---|---|---|---|
| CN | 103730469 A | | 4/2014 | |
| CN | 107039444 A | | 8/2017 | |
| CN | 108109966 A | * | 6/2018 | H01L 27/11 |
| CN | 110896077 A | * | 3/2020 | H10B 12/00 |
| TW | 441027 B | | 6/2001 | |

* cited by examiner

STATIC RANDOM ACCESS MEMORY CELL AND METHOD FOR FORMING SAME

CROSS-REFERENCE TO RELATED APPLICATIONS

This application is a U.S. continuation application of International Application No. PCT/CN2021/137453, filed Dec. 13, 2021, which claims priority to Chinese Patent Application No. 202111172987.1, filed Oct. 8, 2021. International Application No. PCT/CN2021/137453 and Chinese Patent Application No. 202111172987.1 are incorporated herein by reference in their entireties.

BACKGROUND

Static Random Access Memory (SRAM) as a member of the memories, which has advantages of high speed, low power consumption and compatibility with standard technology, etc., is widely used in the fields such as personal computers, personal communications, consumer electronics products, for example smart cards, digital cameras, multimedia players.

In the related art, it is difficult to shrink the source and drain channels in Negative channel Metal Oxide Semiconductor (NMOS) and Positive channel Metal Oxide Semiconductor (PMOS) in a SRAM cell, and it is difficult to reduce the Signal Noise Margin (SNM), which affects the circuit performance.

SUMMARY

The present disclosure relates to the field of semiconductor technology, and relates to, but is not limited to, a static random access memory cell and a method for forming the same.

In a first aspect, the embodiments of the present disclosure provide a method for forming a static random access memory cell, including the following operations.

A base is provided; in which the base at least includes a substrate and an active area formed in the substrate. Trenches extending in a first direction and arranged in a second direction are formed in the active area. Second gate structures extending in the first direction are formed in the trenches. The second gate structures are trimmed in the second direction to form first gate structures. In a memory including static random access memory cells, every two rows of the first gate structures and the first gate structures separated by two rows have same opening positions. Recessed channel array transistors are formed based on the first gate structures. A static random access memory cell with six transistors are formed based on the recessed channel array transistors.

In a second aspect, the embodiments of the present disclosure provide a static random access memory cell, and each static random access memory cell includes six transistors. The six transistors include a first pull-up transistor, a second pull-up transistor, a first pull-down transistor, a second pull-down transistor, a first passing gate transistor and a second passing gate transistor. Each of the transistors is a recessed channel array transistor, including: a base, at least including a substrate and an active area formed in the substrate; first gate structures located in the base, and extending in a first direction and arranged in a second direction. In a memory including static random access memory cells, every two rows of the first gate structures and the first gate structures separated by two rows have same opening positions.

BRIEF DESCRIPTION OF THE DRAWINGS

In the accompanying drawings (which are not necessarily drawn to scale), the similar reference numerals may describe similar components in different views. The similar reference numerals with different letter suffixes may denote different examples of similar components. The drawings generally illustrate by way of example and not limitation various embodiments discussed herein.

DETAILED DESCRIPTION

Figure 1A:
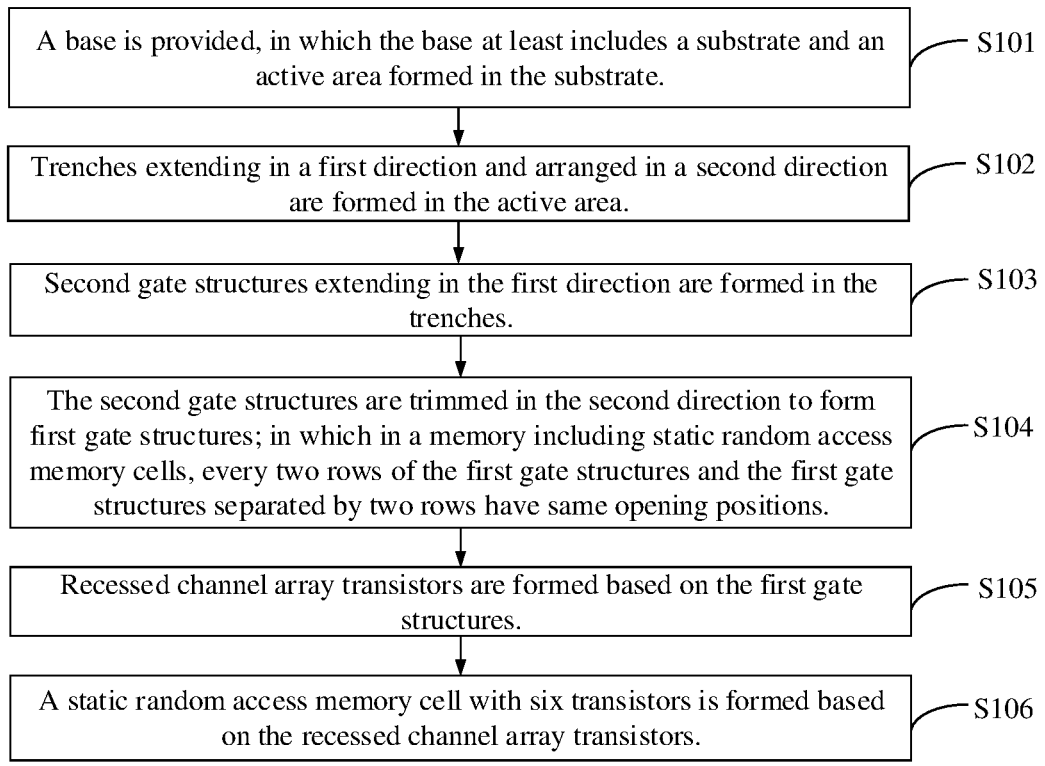
FIG. 1A is a schematic flow chart of an implementation of a method for forming a static random access memory cell provided by the embodiments of the disclosure.

Exemplary implementation modes of the present disclosure will be described in more detail below with reference to the accompanying drawings. Although exemplary implementation modes of the present disclosure are shown in the drawings, it will be understood that the present disclosure may be implemented in various forms and will not be limited to the specific implementation modes set forth herein. Rather these implementation modes are provided so that the disclosure will be more thoroughly understood and the scope of the disclosure will be fully conveyed to those skilled in the art.

In the following description, numerous specific details are given to provide a more thorough understanding of the disclosure. However, it will be apparent to those skilled in the art that the present disclosure may be implemented without one or more of these details. In other examples, some technical features well known in the art are not described in order to avoid confusion with the present disclosure. That is, not all of the features of the actual embodiments are described herein, and well-known functions and structures are not described in detail.

Embodiments of the present disclosure provide a method for forming a static random access memory cell, as shown in FIG. 1A, the method includes S101 to S106.

In S101, a base is provided, in which the base at least includes a substrate and an active area formed in the substrate.

Here, the substrate may be a silicon (Si) substrate, a germanium (Ge) substrate, a germanium-silicon (SiGe) substrate, a gallium arsenide substrate, a ceramic substrate, a quartz substrate, or a glass substrate for a display, or may also include multiple layers, such as a silicon on insulator (SOI) substrate, a germanium on insulator (GOI) substrate, or the like.

In S102, trenches extending in a first direction and arranged in a second direction are formed in the active area.

Here, the base may include a top surface at the front and a bottom surface at the back opposite to the front. A direction perpendicular to the top and bottom surfaces of the base is defined as a third direction in the case of ignoring the flatness of the top and bottom surfaces. In the direction of the top surface and the bottom surface of the base (that is, the plane where the base is located), a first direction and a second direction intersecting each other (e.g. perpendicular to each other) are defined. For example, the extension direction of the trenches may be defined as a first direction, and the arrangement direction of the trenches may be defined as a second direction. The plane direction of the base may be determined based on the first direction and the second direction. The first direction, the second direction and the third direction are pairwise perpendicular. In the embodiments of the present disclosure, the first direction is defined as an X-axis direction, the second direction is defined as a Y-axis direction, and the third direction is defined as a Z-axis direction.

Here, self-aligned double patterning (SADP) process may be used to form trenches, or self-aligned quadruple patterning (SAQP) process may also be used to form trenches.

In S103, second gate structures extending in the first direction are formed in the trenches.

Here, the extension direction of the trenches is the same as the extension direction of the second gate structures. The material of the second gate structures may be a metal, polysilicon, a conductive metal oxide, a conductive metal nitride or the like. For example, it may be a metal such as tungsten, copper, aluminum, silver, or titanium.

In S104, the second gate structures are trimmed in the second direction to form first gate structures. In a memory including static random access memory cells, every two rows of the first gate structures and the first gate structures separated by two rows have same opening positions.

Here, it may be understood that a long second gate structure is cut off to form short first gate structures. The second gate structure can be dry etched or wet etched to form the first gate structures. The first gate structures are used to connect with the word lines, and the voltage signal on the word lines can control the turn-on or turn-off of the transistor.

In S105, recessed channel array transistors are formed based on the first gate structures.

Here, the recessed array transistors have a buried gate structure, which can increase the integration of the semiconductor process and reduce the element dimension.

In S106, a static random access memory cell with six transistors is formed based on the recessed channel array transistors.

Here, the SRAM cell includes a plurality of recessed channel array transistors, such as including 10, 8, 6, or other number of recessed channel array transistors. In general, a static random access memory including six transistors (6T SRAM) is widely used. The following embodiments of the present disclosure will be described taking 6T SRAM as an example.

In the embodiments of the present disclosure, trenches are formed in the active area of the base, and then buried first gate structures are formed in the trenches. Recessed channel array transistors are formed based on the first gate structures, and finally a static random access memory cell is formed. The buried first gate structure is different from the planar gate structure formed on the surface of the substrate in the related art. That is, the gate in the SRAM of the embodiments of the present disclosure is improved from planar to recessed, so that a longer channel length can be obtained under a same layout in the device, thereby obtaining a better SNM, and also maintaining a sufficient trench length to reduce the leakage problem.

FIGS. 1B-1H are schematic diagrams of the forming process of a static random access memory cell provided by the embodiments of the disclosure. Next, the above S101-S106 will be further described in combination with FIGS. 1B-1H.

Figure 1B:
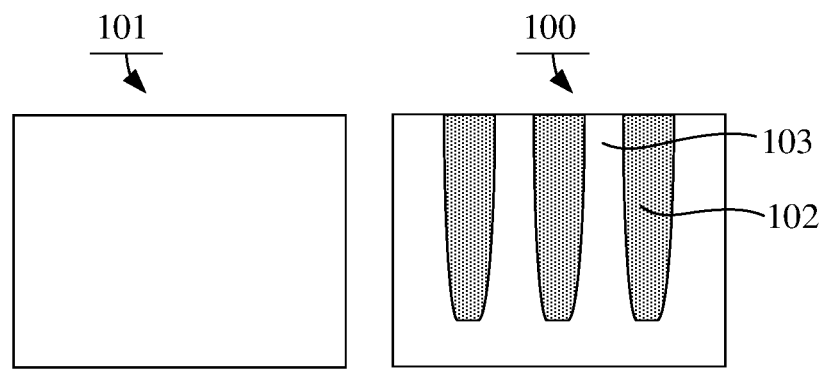
FIGS. 1B-1H are schematic structural diagrams of the forming process of a static random access memory cell provided by the embodiments of the disclosure.

As shown in the left and right diagrams in FIG. 1B, shallow trench isolations (STI) 102 are formed in the substrate 101, and the shallow trench isolations 102 isolate a plurality of active areas 103 in the substrate 101, thus forming the base 100.

A STI may be formed by forming an isolation trench in the substrate and then filling an isolation material layer in the isolation trench. The material filling in the STI may include silicon nitride, silicon oxide or the like, and silicon oxide may be formed by thermally oxidizing a silicon substrate. The STI may isolate a plurality of active areas distributed in an array or otherwise in the substrate.

Here, the substrate may be partially doped to form an n-type doped active area, and the doped element may be phosphorus, arsenic, boron or other suitable element.

Figure 1C:
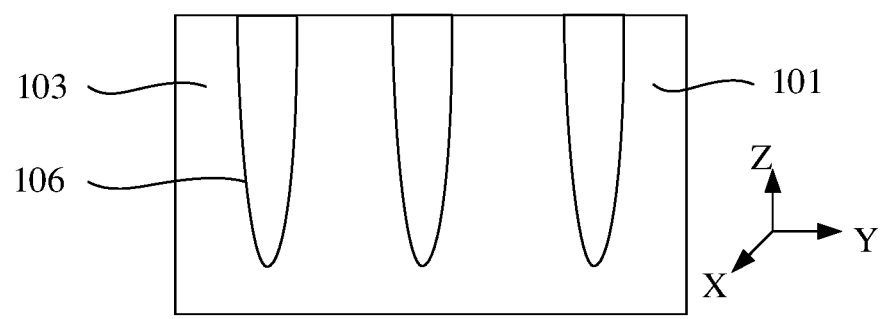

Referring to FIG. 1C, trenches 106 extending in the X-axis direction and arranged in the Y-axis direction are formed in the active area 103 by self-aligned double patterning.

In some embodiments, the active areas may include a source-drain region, in which the source-drain region includes a source region and a drain region located on either side of a trench respectively. In addition, a low-doped drain region may also be formed near the drain region. The low-doped drain region is able to withstand a partial voltage.

Figure 1D:
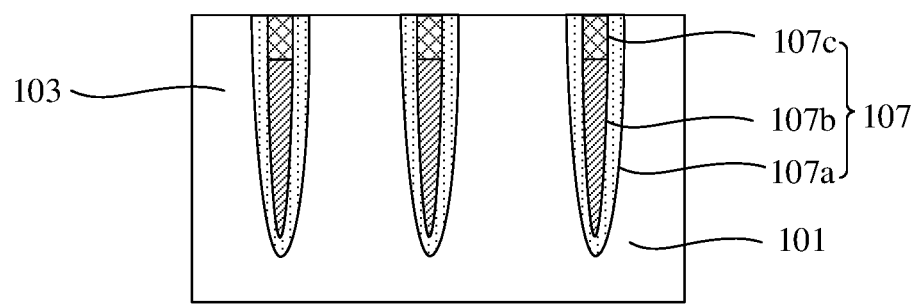

Referring to FIG. 1C, second gate structures 107 extending in the X-axis direction as shown in FIG. 1D are formed in the trenches 106.

In some embodiments, referring to FIG. 1D again, the second gate structures 107 include an isolation layer 107a and a conductive layer 107b. The isolation layer 107a is located on the inner surface of the trenches 106, that is, the sidewalls and the bottoms of the trenches 106 are both covered with the isolation layer 107a. The top surface of the conductive layer 107b is lower than the surface of the substrate 101.

The material of the isolation layer may be silica, which may be formed by thermal oxidation or by any of: chemical vapor deposition (CVD), physical vapor deposition (PVD), atomic layer deposition (ALD), or any other suitable deposition process.

The material of the conductive layer may be one or more of polysilicon, a metal silicide compound, a conductive metal nitride (e.g. titanium nitride (TiN), tantalum nitride (TaN), tungsten nitride (WN), etc.), or a metal (e.g. tungsten (W), titanium (Ti), tantalum (Ta), etc.). The manner for forming the conductive layer includes any of: chemical vapor deposition, physical vapor deposition, plasma enhanced chemical vapor deposition (PECVD), atomic layer deposition, or any other suitable deposition process.

In some embodiments, referring to FIG. 1D again, the second gate structures 107 further include an insulating layer 107c located on the conductive layer 107b. The top surface of the insulating layer 107c is flush with the top surface of the substrate 101, and the material of the insulating layer 107c may be a high dielectric constant material such as silicon nitride.

Figure 1E:
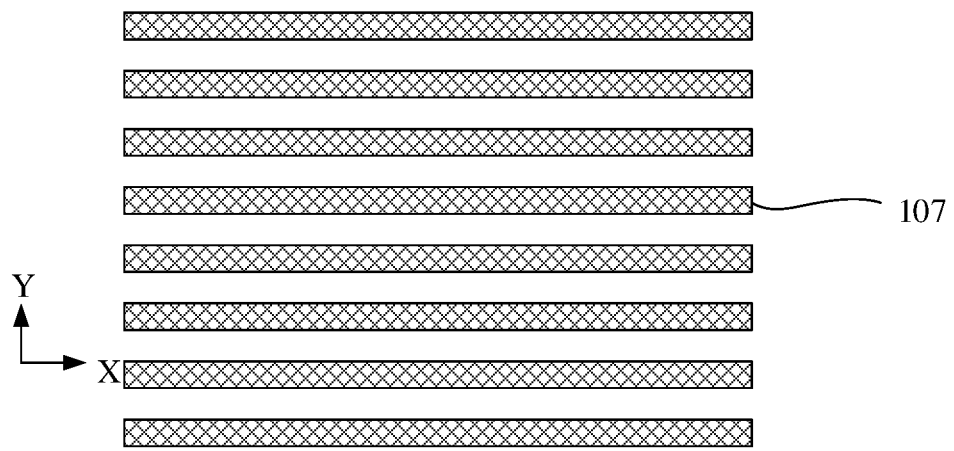

Referring to FIG. 1E, which is a top view of the second gate structures in FIG. 1D. The second gate structure 107 is etched in the Y-axis direction to form first gate structures 108 shown in FIG. 1F, and every two rows of the first gate structures and the first gate structures separated by two rows have same opening positions 108a.

Figure 1F:
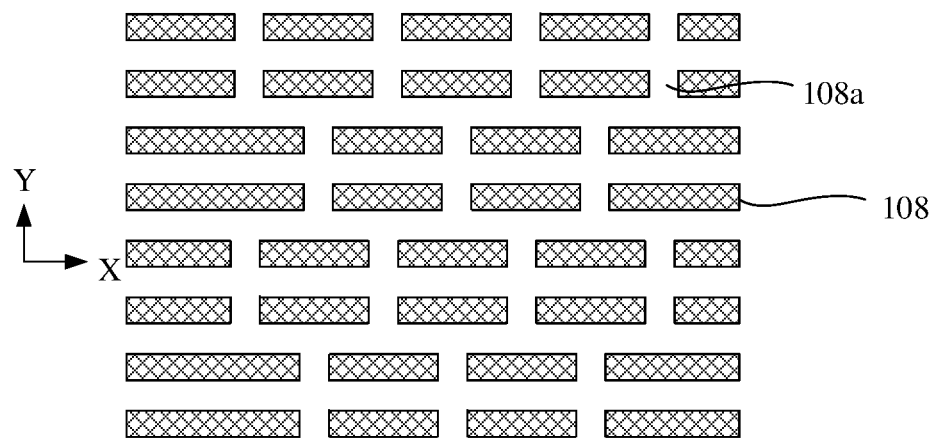
Figure 1G:
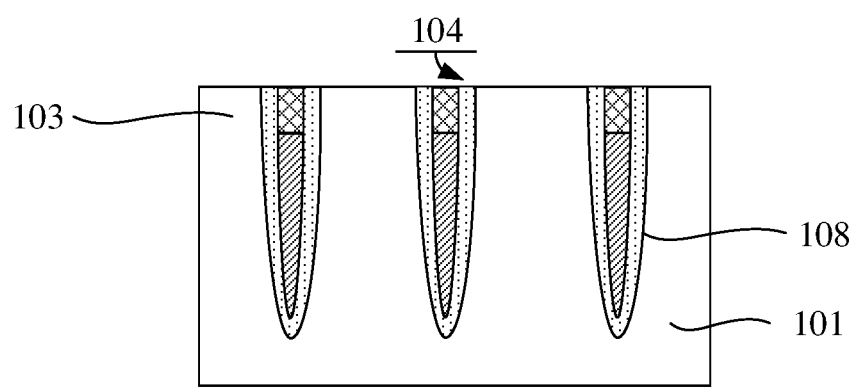

Referring to FIG. 1G, recessed channel array transistors 104 are formed based on the first gate structures 108. Buried first gate structures 108 are adopted in the recessed channel array transistors 104. A static random access memory cell 105 with six transistors as shown in FIG. 1H is formed based on the recessed channel array transistors 104.

In the SRAM cell provided by the embodiments of the present disclosure, buried gate structures are adopted That is, the upper surface of the gate structure in the embodiments of the present disclosure is lower than the upper surface of the substrate, and the gate structure is no longer a planar gate structure formed on the base or the substrate in the related art. Therefore, in the SRAM, a longer channel length can be obtained under a same layout, and a better SNM can be obtained. FIG. 1I is a schematic diagram of a planar gate structure provided in the related art. Referring to FIG. 1I, a source/drain region 202 and a lightly-doped drain region 203 are formed in the substrate 201. A gate structure 204 and a dielectric layer 206, as well as sidewalls 205 located on both sides of the gate structure 204 and the dielectric layer 206, are formed on the substrate 201. As can be seen from FIG. 1I, the bottom surface of the gate structure 204 in the related art is on the upper surface of the substrate. In other related art, the planar gate structure may also include the situation that the upper surface of the gate structure 204 is higher than the upper surface of the substrate.

Figure 1H:
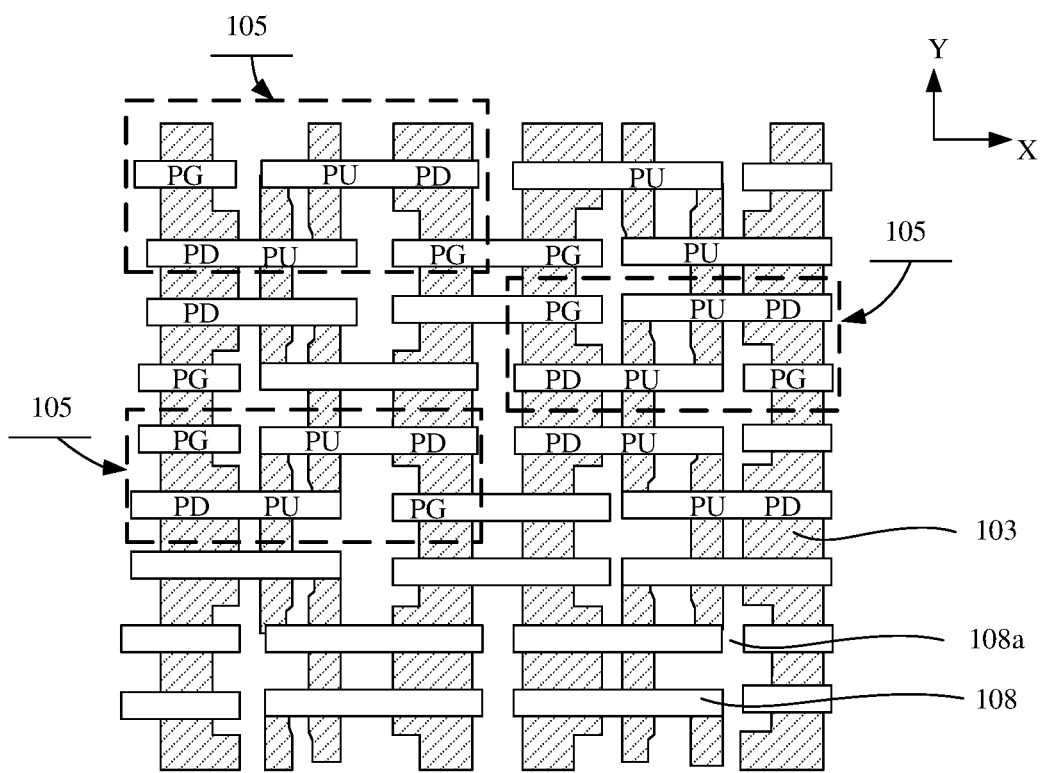
Figure 1I:
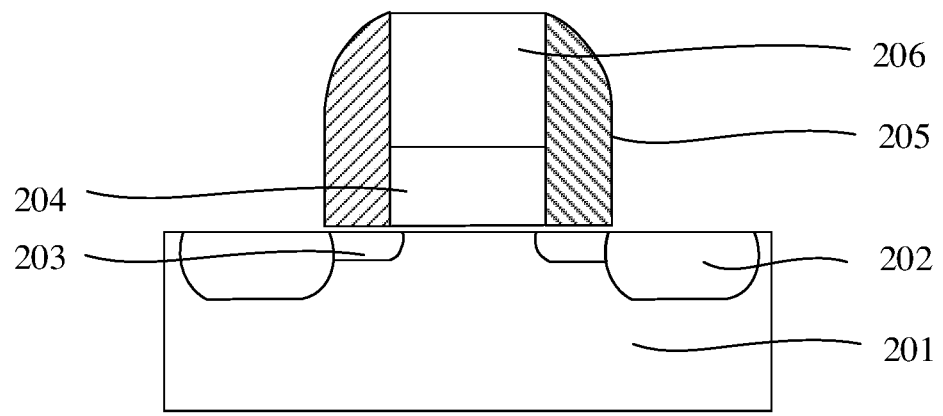
FIG. 1I is a schematic diagram of a planar gate structure in the related art.

The circuit layout of the SRAM provided in the related art may adopted for the layout structure of the SRAM shown in FIG. 1H provided by the embodiments of the present disclosure, with the difference that the transistors in the SRAM are recessed channel array transistors and the gate structure is buried.

The 6T SRAM in related art consists of two passing gate (PG) negative channel metal oxide semiconductors (NMOS), two pull-up (PU) positive channel metal oxide semiconductors (PMOS) and two pull-down (PD) negative channel metal oxide semiconductors.

Figure 1J:
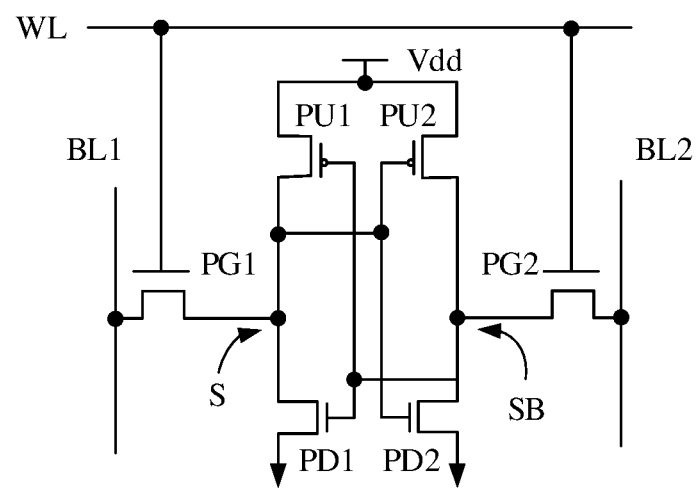
FIG. 1J is a circuit structure diagram of a 6T SRAM in the related art.

FIG. 1J is a circuit structure diagram of a 6T SRAM in the related art. Referring to FIG. 1J, two PGs are respectively denoted as PG1 and PG2, two PUs are respectively denoted as PU1 and PU2, and two PDs are respectively denoted as PD1 and PD2. PU1 and PD1 constitute a first phase inverter, and PU2 and PD2 constitute a second phase inverter. The first phase inverter and the second phase inverter are cross-coupled, i.e., the input end of the first phase inverter is electrically connected with the output end of the second phase inverter, and the output end of the first phase inverter is electrically connected with the input end of the second phase inverter, so as to form a latch circuit for latching data logic values. The drain of PU1, the drain of PD1, the drain of PG1, the gate of PU2 and the gate of PD2 are electrically connected to form a first storage node S. The gate of PU1, the gate of PD1, the drain of PU2, the drain of PD2 and the drain of PG2 are electrically connected to form a second storage node SB.

Figure 1K:
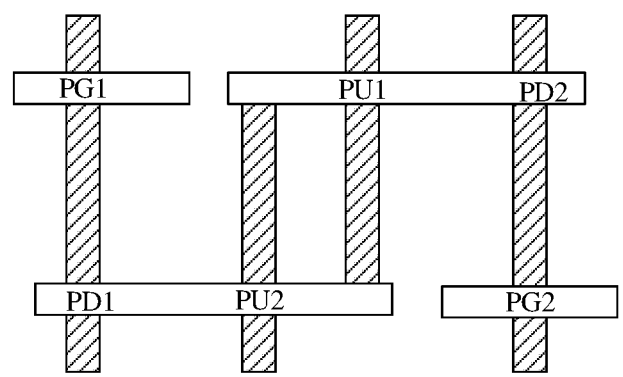
FIG. 1K is a layout structure diagram of a 6T SRAM circuit structure corresponding to FIG. 1J.

Referring to both FIGS. 1J and 1K, FIG. 1K is a layout structure corresponding to the circuit shown in FIG. 1J. PG1 and PD1 are located in a same active area and share a same drain, and PG2 and PD2 are located in a same active area and share a same drain. When the first storage node S is pulled down to a low potential, the second storage node SB is pulled up to a high potential, or when the first storage node S is pulled up to a high potential, the second storage node SB is pulled down to a low potential. The first storage node S and the second storage node SB form a complementary pair. The gate of PG1 and the gate of PG2 are electrically connected with a word line (WL). The source of PG1 is electrically connected with a first bit line BL1; and the source of PG2 is electrically connected with a second bit line BL2. The first bit line BL1 and the second bit line BL2 are complementary bit lines to each other. The source of PU1 and the source of PU2 are electrically connected with a power supply line Vdd; and the source of PD1 and the source of PD2 are electrically connected to the earth wire. When the voltage of the word line WL is switched to a system high voltage, PG1 and PG2 are turned on to allow the first storage node S and the second storage node SB to read and write data logic values through the first bit line BL1 and the second bit line BL2. When the voltage of the word line WL is switched to a system low voltage, PG1 and PG2 are turned off, so that the first storage node S and the second storage node SB are isolated from the first bit line BL1 and the second bit line BL2. The power supply line Vdd ensures that the states of the first storage node S and the second storage node SB are maintained.

On the basis of a method for forming a static random access memory cell as shown in FIG. 1A, the embodiments of the present disclosure provide a SRAM cells 105 as shown in FIG. 1H. Referring to both FIGS. 1G and 1H, each static random access memory cell 105 includes six transistors The six transistors include a first pull-up transistor PU1, a second pull-up transistor PU2, a first pull-down transistor PD1, a second pull-down transistor PD2, a first passing gate transistor PG1 and a second passing gate transistor PG2. Each of the transistors is a recessed channel array transistor 104 including a base and first gate structures 108.

The base at least includes a substrate 101 and an active area 103 formed in the substrate 101.

The first gate structures 108 are located in the base, and extend in a first direction (X-axis direction) and are arrange in a second direction (Y-axis direction). In a memory including static random access memory cells, every two rows of the first gate structures 108 and the first gate structures 108 separated by two rows have same opening positions.

In some embodiments, referring to FIG. 1D, A first gate structure includes an isolation layer 107a and a conductive layer 107b formed on the isolation layer 107a. The surface of the conductive layer 107b is lower than the surface of the substrate 101.

Figure 2A:
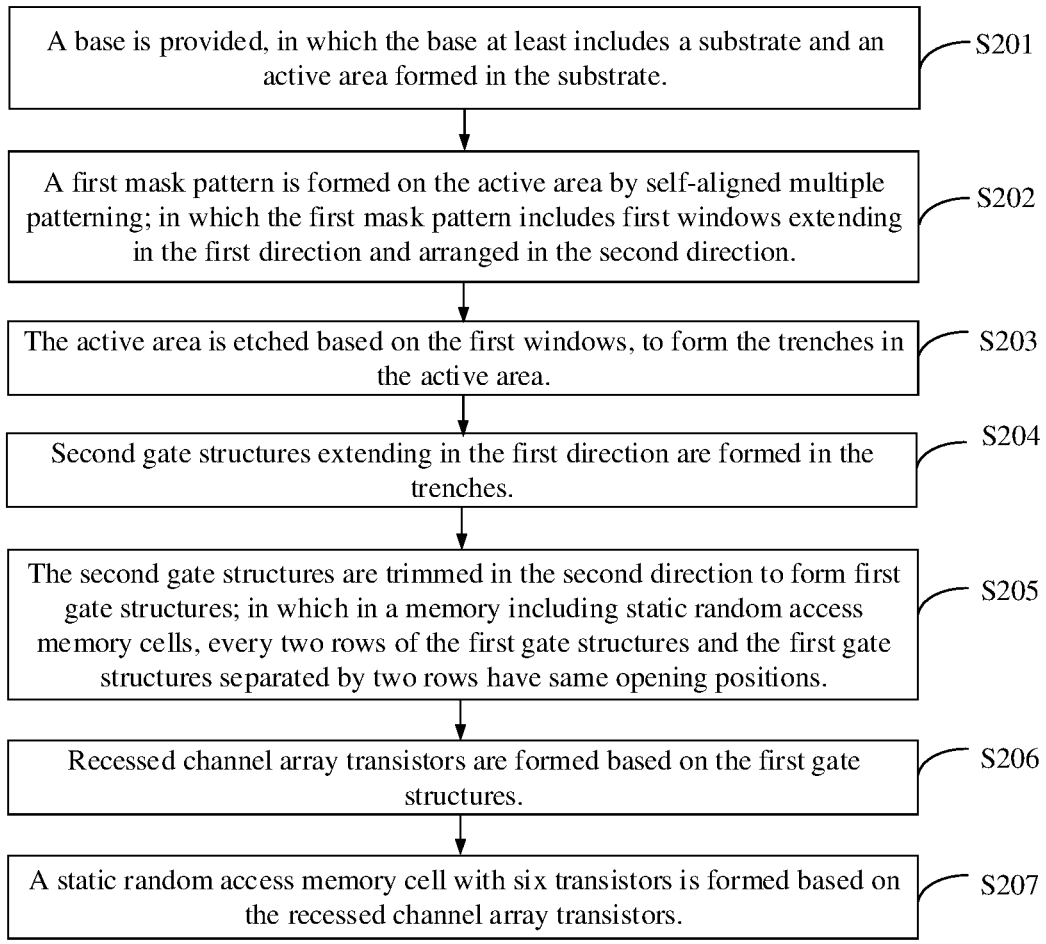
FIG. 2A is a schematic flow chart of an implementation of a method for forming a static random access memory cell provided by the embodiments of the disclosure.

The embodiments of the present disclosure provide a method for forming a static random access memory cell, as shown in FIG. 2A, the method includes the following S201 to S207.

In S201, a base is provided, in which the base at least includes a substrate and an active area formed in the substrate.

S201 is the same as S101 and can be understood with reference to S101.

In S202, a first mask pattern is formed on the active area by self-aligned multiple patterning. The first mask pattern includes first windows extending in the first direction and arranged in the second direction.

Here, the first mask pattern can be obtained by exposing the photoresist layer with a preset mask. The first windows correspond to the positions of the trenches, and the first windows can expose a part of the active area.

In S203, the active area are etched based on the first windows, to form the trenches in the active area.

Here, the active area are etched by dry etching or wet etching to form the trenches. For example, the active area may be etched by reactive ion etching or high density plasma etching; or the active area may also be etched with an etchant such as sulfuric acid, hydrofluoric acid, nitric acid.

In S204, second gate structures extending in the first direction are formed in the trenches.

In S205, the second gate structures are trimmed in the second direction to form first gate structures. In a memory including static random access memory cells, every two rows of the first gate structures and the first gate structures separated by two rows have same opening positions.

Here, split gate structures in the SRAM is formed by trimming the second gate structures.

In S206, recessed channel array transistors are formed based on the first gate structures.

In S207, a static random access memory cell with six transistors is formed based on the recessed channel array transistors.

S204 to S207 are the same as S103 to S106 and can be understood with reference to S103 to S106.

In the embodiments of the present disclosure, trenches are formed in the base by self-aligned multiple patterning, so that the multiplication of the number of the trenches is achieved, and a better size resolution is obtained. The second gate structures are formed in the trenches, and the second gate structures are trimmed to form first gate structures, and then a static random access memory cell with six transistors is formed. Since the recessed channel array transistor is employed, a sufficient trench length can be maintained to reduce the leakage problem.

In some embodiments, S202 may include S202a to S202e.

Figure 2B:
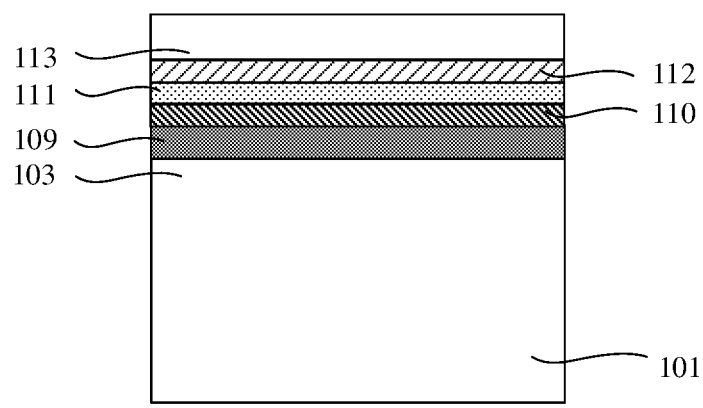
FIGS. 2B-2I are schematic diagrams of the forming process of a static random access memory cell provided by the embodiments of the disclosure.

In S202a, referring to FIG. 2B, a nitride layer 109, a first mask layer 110, a second mask layer 111, a first anti reflectivity coating 112 and a first photoresist layer 113 as shown in FIG. 2B are sequentially formed on the base 100. The shallow trench isolations 102 shown in FIG. 1B are not shown in FIG. 2B. In some embodiments, a nitride layer may not be formed on the base.

The first anti reflectivity coating may be one or a stack of both of a bottom anti reflectivity coating (BARC) and a dielectric anti reflectivity Coating (DARC). The bottom anti reflectivity coating is generally an organic material, and the dielectric anti reflectivity coating is generally an inorganic material. Relatively speaking, the cost of the dielectric anti reflectivity coating is lower, but its anti-reflection effect is not as good as that of the bottom anti reflectivity coating. Moreover, its process window is small, so it is necessary to strictly control the thickness and the uniformity of the bottom film to ensure the anti-reflection effect. In the embodiment, the material of the first anti reflectivity coating may be silicon oxynitride (SiON).

The first mask layer may have a double-layer structure, or a single-layer structure. The material of the first mask layer can be one or more of silicon oxide, silicon nitride, silicon carbide, silicon oxynitride, amorphous carbon, polysilicon, hafnium oxide, titanium oxide, zirconia, titanium nitride, tantalum nitride or titanium. The first mask layer may be formed by any one of: chemical vapor deposition, physical vapor deposition, atomic layer deposition or any other suitable deposition process.

On the one hand, the nitride layer serves as a passivation layer to protect the active areas during depositing the isolation layer and the conductive material in the trenches. On the other hand, the nitride layer may serve as a grinding barrier layer in the subsequent chemical mechanical polishing (CMP) of the isolation layer. The nitride layer is manufactured by low-pressure chemical vapor deposition (LPCVD). The material of the nitride layer may be silicon nitride, which may be formed by the reaction of ammonia with dichlorosilane.

The second mask layer may be silicon nitride, silicon carbide, or silicon oxynitride, and may be formed by a same deposition process as that of the first mask layer.

Figure 2C:
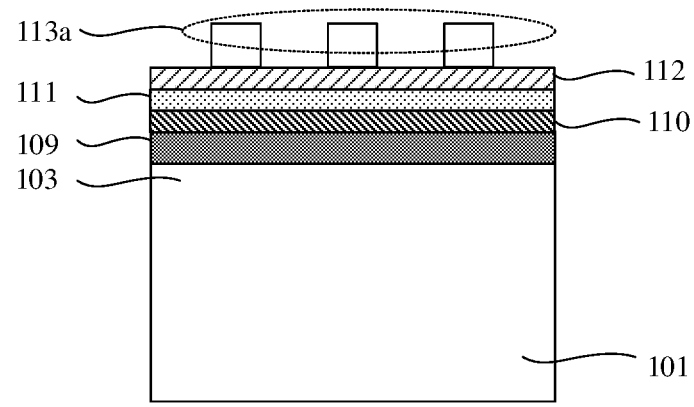

In S202b, referring to FIG. 2B, a first initial mask 113a as shown in FIG. 2C is formed in the first photoresist layer 113 by exposing, developing or the like.

Figure 2D:
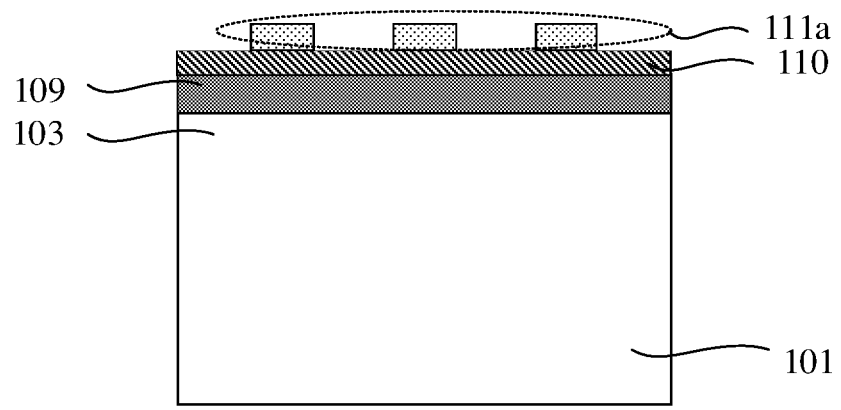

In S202c, referring to FIG. 2C, the second mask layer 111 is etched with the first initial mask 113a to transfer the pattern of the first initial mask 113a to the second mask layer 111, remaining the etched second mask layer 111a as shown in FIG. 2D.

Figure 2E:
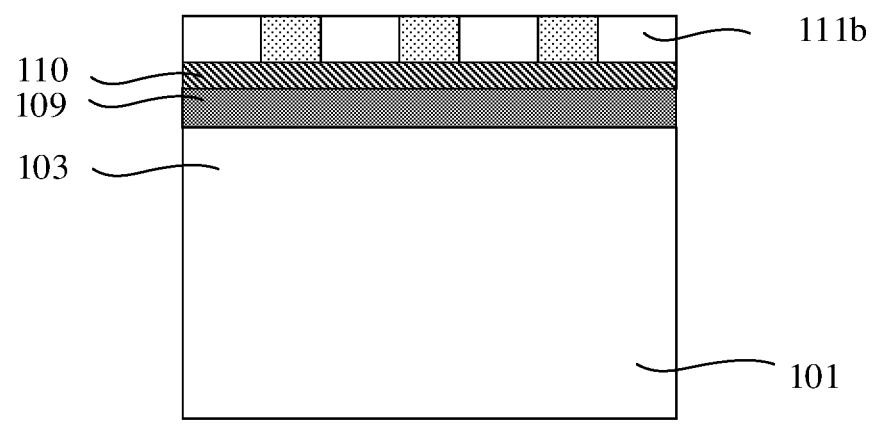
Figure 2F:
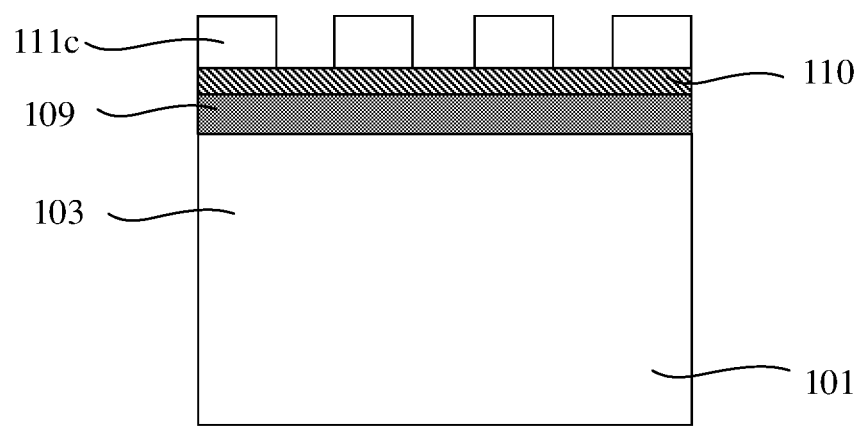

In S202d, referring to FIG. 2D, an insulating material 111b as shown in FIG. 2E is deposited on the surface of the etched second mask layer 111a, and the etched second mask layer 111a is removed to form the isolation sidewalls 111c as shown in FIG. 2F.

Figure 2G:
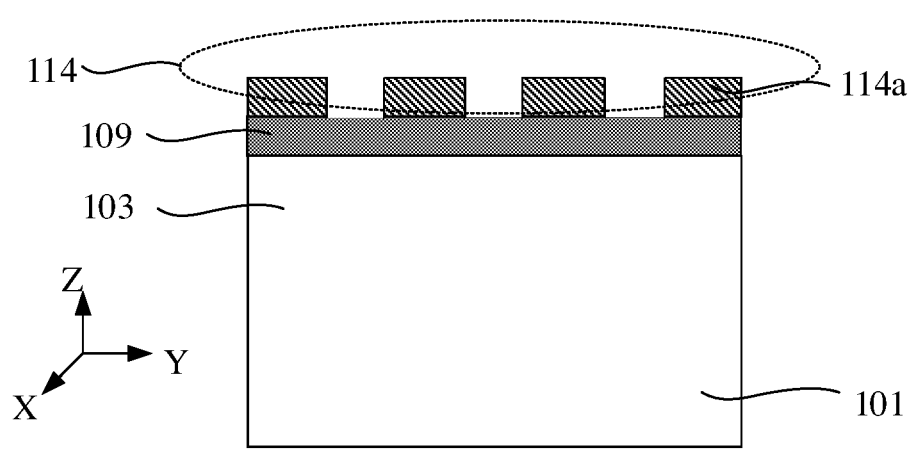

In S202e, referring to FIG. 2F, the first mask layer 110 is etched with the isolation sidewalls 111c to transfer the pattern of the isolation sidewalls 111c to the first mask layer 110, so as to form the first mask pattern 114 as shown in FIG. 2G. The first mask pattern 114 includes first windows 114a extending in the X-axis direction and arranged in the Y-axis direction, in which the first windows 114a defines the positions of the trenches 106.

Referring to FIG. 2G, S203 is performed. The active area 103 are etched based on the first windows 114a by dry etching, to form the trenches 106 as shown in FIG. 2H in the active area 103.

Figure 2H:
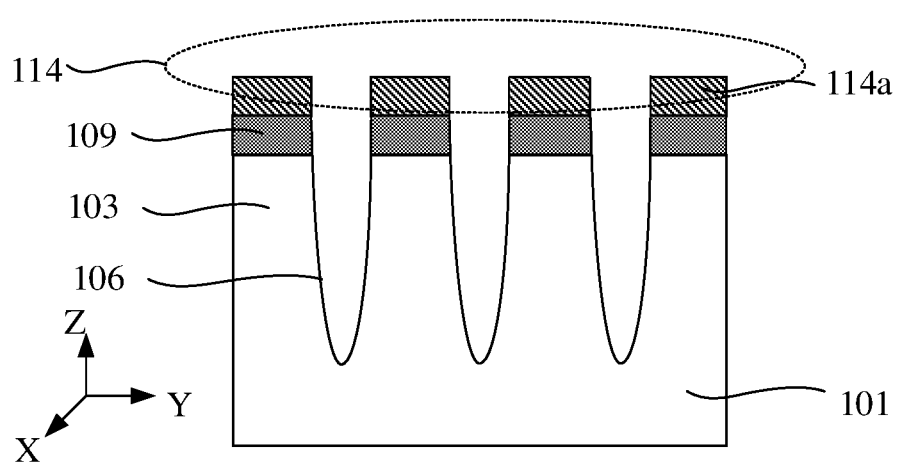
Figure 2I:
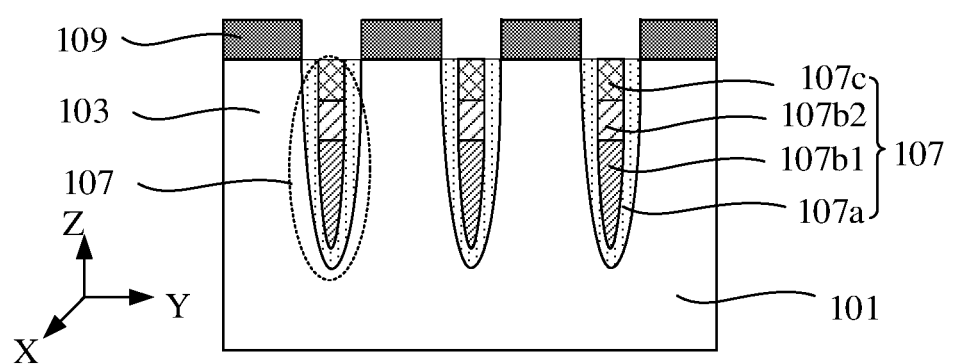

Referring to FIG. 2H, S204 is performed. Second gate structures 107 extending in the first direction as shown in FIG. 2I are formed in the trenches 106.

Then S205 to S207 are performed to form a static random access memory cell 105 with six transistors as shown in FIG. 1H.

Figure 3A:
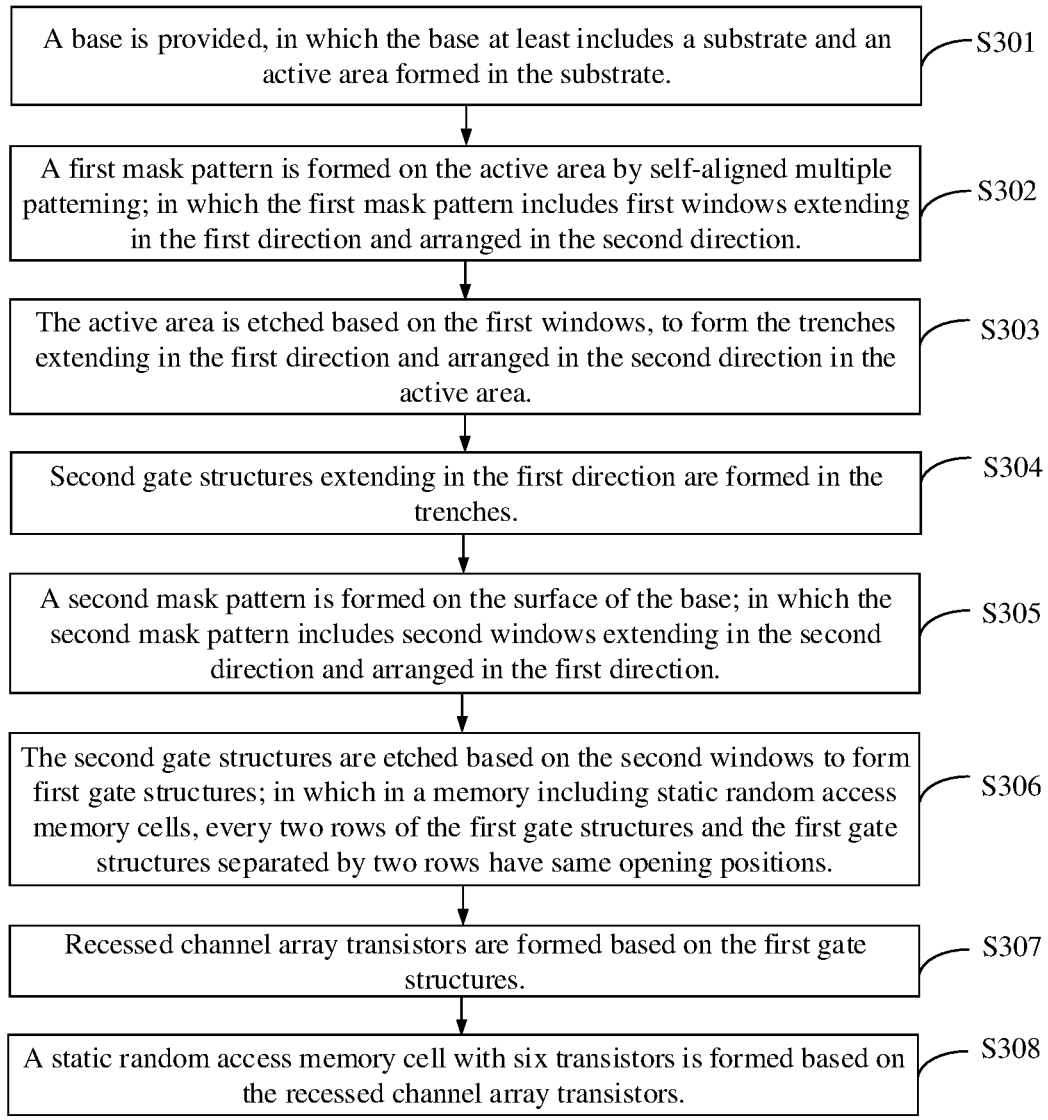
FIG. 3A is a schematic flow chart of an implementation of a method for forming a static random access memory cell provided by the embodiments of the disclosure.

The embodiments of the present disclosure provide a method for forming a static random access memory cell, as shown in FIG. 3A, the method includes S301 to S308.

In S301, a base is provided, in which the base at least includes a substrate and an active area formed in the substrate.

S301 is the same as S101 and can be understood with reference to S101.

In S302, a first mask pattern is formed on the active area by self-aligned multiple patterning. The first mask pattern includes first windows extending in the first direction and arranged in the second direction.

In S303, the active area are etched based on the first windows, to form the trenches extending in the first direction and arranged in the second direction in the active area.

S302 to S303 are the same as S202 to S203 and can be understood with reference to S202 to S203.

In S304, second gate structures extending in the first direction are formed in the trenches.

In some embodiments, a second gate structure includes an isolation layer and a conductive layer. S304 may be implemented by S304a and S304b.

Figure 3B:
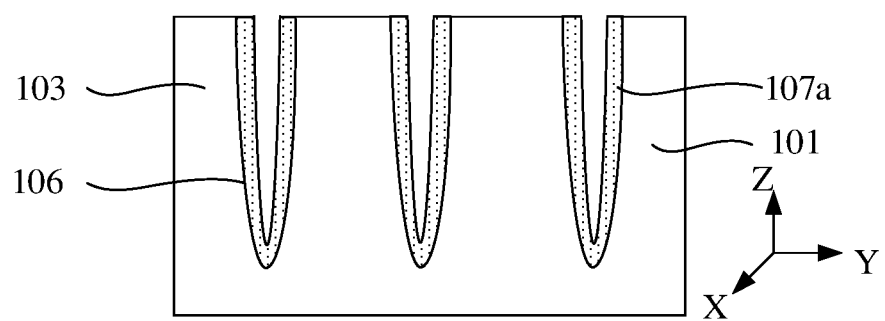
FIGS. 3B-3F are schematic diagrams of the forming process of a static random access memory cell provided by the embodiments of the disclosure.

In S304a, referring to FIG. 3B, an isolation layer 107a is formed on an inner surface of a trench 106.

Here, the isolation layer may be a silica ($SiO_2$) layer. The manner for forming the isolation layer includes any one of: chemical vapor deposition, physical vapor deposition, atomic layer deposition, or any other suitable deposition process.

In some embodiments, a thickness of the isolation layer and a dimension of the recessed channel array transistors satisfy a preset ratio relationship.

In some embodiments, the thickness of the isolation layer is 15 Å to 25 Å. In a dynamic random access memory, the thickness of an isolation layer is 30 Å to 50 Å, while in a SRAM, a thin oxide is used, the thickness of which is 15 Å to 25 Å, which can obtain a better device performance.

In S304b, referring to FIG. 3B, a conductive layer 107b in the trenches 106 as shown in FIG. 1D is formed on the isolation layer 107a to form second gate structures 107 extending in the X-axis direction in the trenches 106. The surface of the conductive layer 107b is lower than the surface of the substrate 101.

Figure 3C:
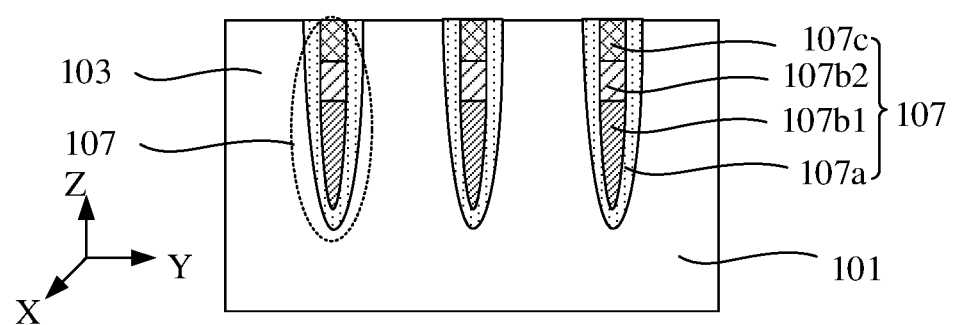

In some embodiments, S304b may be implemented by the operation A0 where referring to FIG. 3C, a metal layer 107b1 and a polysilicon layer 107b2 located in the trenches are sequentially formed on the isolation layer 107a. The polysilicon layer can be replaced by a material with a low work function. A tungsten layer and a polysilicon layer are used for the second gate structures, which can obtain a better performance. The formation of the second gate structures by using a tungsten layer alone requires adjusting the channel injection to obtain a larger SNM.

In some embodiments, after operation A0, operation A1 is further included: referring to FIG. 3C again, an insulating layer 107c is formed on the polysilicon layer 107b2. The surface of the insulating layer 107c is flush with the surface of the substrate 101. The insulating layer is isolated from the source/drain region by the isolation layer. The material of the insulating layer may include a high dielectric constant material such as silicon nitride.

In S305, a second mask pattern is formed on the surface of the base. The second mask pattern includes second windows extending in the second direction and arranged in the first direction.

Here, the second windows define the positions of the openings.

In some embodiments, S305 may include S305a to S305c.

Figure 3D:
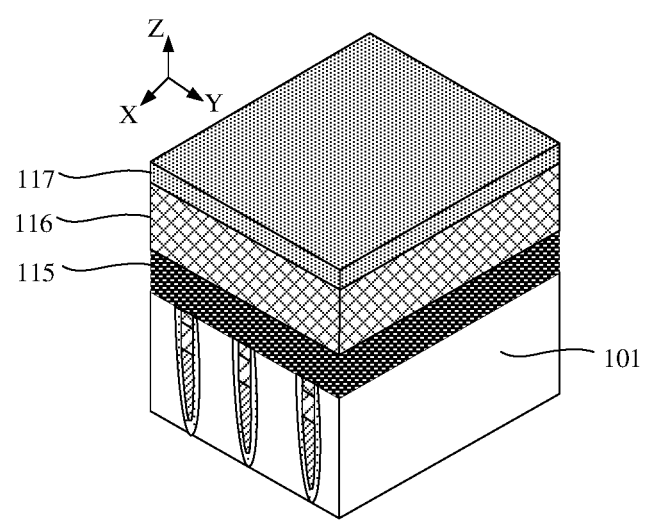

In S305a, referring to FIG. 3D, a third mask layer 115, a second anti reflectivity coating 116, and a second photoresist layer 117 are sequentially formed on the base in which the second gate structures are formed.

Here, the material of the third mask layer may be the same as that of the first mask layer or as that of the second mask layer, and their forming processes may also be the same; the material of the second anti reflectivity coating may be the same as that of the first anti reflectivity coating, and their forming processes may also be the same.

Figure 3E:
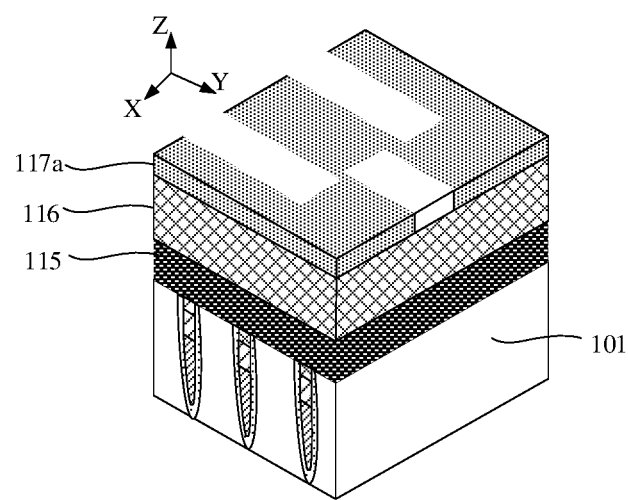

In S305b, referring to FIG. 3D, a second initial mask 117a as shown in FIG. 3E is formed in the second photoresist layer 117 by exposing, developing or the like.

Figure 3F:
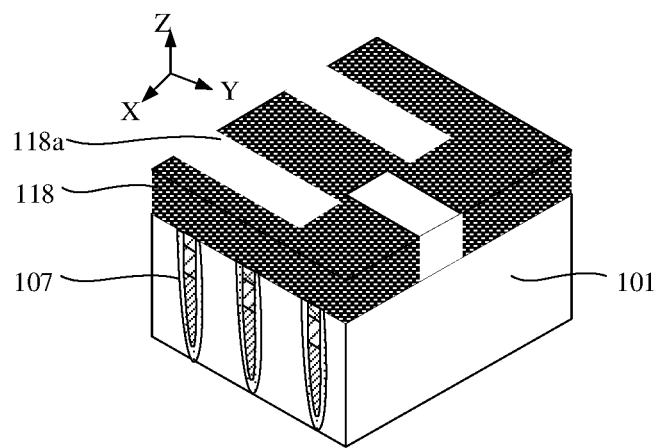

In S305c, referring to FIG. 3E, the third mask layer 115 is etched with the second initial mask 117a to transfer the pattern of the second initial mask 117a to the third mask layer 115, so as to form a second mask pattern 118 as shown in FIG. 3F. The second mask pattern 118 includes second windows 118a extending in the Y-axis direction and arranged in the X-axis direction.

In S306, the second gate structures are etched based on the second windows to form first gate structures In a memory including static random access memory cells, every two rows of the first gate structures and the first gate structures separated by two rows have same opening positions.

Here, after S306 is performed, the first gate structures as shown in FIG. 1F are formed.

In S307, recessed channel array transistors are formed based on the first gate structures.

In S308, a static random access memory cell with six transistors is formed based on the recessed channel array transistors.

S307 to S308 are the same as S105 to S106 and can be understood with reference to S105 to S106.

In the embodiments of the present disclosure, the trenches are formed in the base by self-aligned multiple patterning. The second gate structures are formed in the trenches. The second gate structures are etched based on the second windows to form recessed channel array transistors having a buried first gate structure. As a result, the gate in the SRAM is improved from planar to recessed, so that a longer channel length can be obtained under a same layout in a device, thereby obtaining a better SNM.

In some embodiments, the first gate structures include an isolation layer and a conductive layer formed on the isolation layer. The surface of the conductive layer is lower than the surface of the substrate.

In some embodiments, the conductive layer in the static random access memory cell includes a metal layer and a polysilicon layer on the metal layer.

In some embodiments, the first gate structures in the static random access memory cell further include an insulating layer located on the polysilicon layer. The surface of the insulating layer is flush with the surface of the substrate.

In some embodiments, the thickness of the isolation layer in the static random access memory cell and the dimension of the recessed channel array transistors satisfy a preset ratio relationship.

In some embodiments, the thickness of the isolation layer in the static random access memory cell is 15 Å to 25 Å.

The features disclosed in several method or static random access memory cell embodiments provided in the present disclosure can be arbitrarily combined without conflict to obtain new method embodiments or static random access memory cell embodiments.

The above description of the static random access memory cell embodiments is similar to the description of the method embodiments described above and has similar beneficial effects as the method embodiments. Technical details not disclosed in the memory cell embodiments of the present disclosure are understood with reference to the description of the method embodiments of the present disclosure.

The descriptions above are only exemplary embodiments of the present disclosure, and are not intended to limit the scope of protection of the present disclosure. Any modification, equivalent replacement and improvement made within the spirit and principles of the present disclosure all shall fall within the protection scope of the present disclosure.

INDUSTRIAL PRACTICALITY

In the embodiments of the present disclosure, recessed channel array transistors having first gate structures are formed in the base, in which the first gate structures are a buried gate structure formed in the trenches after the trenches are formed in the substrate, which is different from the planar gate structure formed on the surface of the substrate in the related art. That is, the gate in the SRAM of the embodiments of the present disclosure is improved from planar to recessed, so that a longer channel length can be obtained under a same layout in a device, thereby obtaining a better SNM.

The invention claimed is:

1. A method for forming a static random access memory cell, comprising:
providing a base; wherein the base at least comprises a substrate and an active area formed in the substrate;
forming trenches extending in a first direction and arranged in a second direction in the active area;
forming second gate structures extending in the first direction in the trenches, wherein the second gate structures include isolation layers, conductive layers and insulating layers, the isolation layers cover sidewalls and bottoms of the trenches, the conductive layers located in the trenches on the isolation layers, the insulating layers located on the conductive layers, top surfaces of the insulating layers are flush with a top surface of the substrate;
trimming the second gate structures in the second direction to form first gate structures; wherein
the forming trenches extending in a first direction and arranged in a second direction in the active area comprises:
forming a first mask pattern on the active area by self-aligned multiple patterning;
wherein the first mask pattern comprises first windows extending in the first direction and arranged in the second direction; and
etching the active area based on the first windows, to form the trenches in the active area;
wherein the trimming the second gate structures in the second direction to form first gate structures comprises:
forming a second mask pattern on a surface of the base; wherein the second mask pattern comprises second windows extending in the second direction and arranged in the first direction; and etching isolation layers, conductive layers and insulating layers based on the second windows to form the first gate structures;
wherein in a memory comprising static random access memory cells, every two rows of the first gate structures and the first gate structures separated by two rows have same opening positions;
forming recessed channel array transistors based on the first gate structures; and
forming the static random access memory cell with six transistors based on the recessed channel array transistors.

2. The method of claim 1, wherein
the forming second gate structures extending in the first direction in the trenches comprises:
forming the isolation layer on an inner surface of the trenches; and
forming the conductive layer located in the trenches on the isolation layer; wherein a surface of the conductive layer is lower than a surface of the substrate.

3. The method of claim 2, wherein
the forming the conductive layer located in the trenches on the isolation layer comprises:
forming a metal layer and a polysilicon layer located in the trenches sequentially on the isolation layer.

4. The method of claim 3, wherein
the method further comprises: after forming the metal layer and the polysilicon layer located in the trenches sequentially on the isolation layer,
forming the insulating layer on the polysilicon layer; wherein a surface of the insulating layer is flush with the surface of the substrate.

5. The method of claim 2, wherein
a thickness of the isolation layer and a dimension of the recessed channel array transistors satisfy a preset ratio relationship.

6. The method of claim 5, wherein
the thickness of the isolation layer is 15 Å to 25 Å.

7. A static random access memory cell, wherein
each static random access memory cell comprises six transistors, wherein the six transistors comprise a first pull-up transistor, a second pull-up transistor, a first pull-down transistor, a second pull-down transistor, a first passing gate transistor and a second passing gate transistor, and each of the transistors is a recessed channel array transistor, comprising:
a base, at least comprising a substrate and an active area formed in the substrate; and
first gate structures located in the base, and extending in a first direction and arranged in a second direction; wherein in a memory including static random access memory cells, every two rows of the first gate structures and the first gate structures separated by two rows have same opening positions;
wherein the static random access memory cell is fabricated by:
providing a base, wherein the base at least comprises a substrate and an active area formed in the substrate;
forming trenches extending in a first direction and arranged in a second direction in the active area;
forming second gate structures extending in the first direction in the trenches, wherein the second gate structures include isolation layers, conductive layers and insulating layers, the isolation layers cover sidewalls and bottoms of the trenches, the conductive layers located in the trenches on the isolation layers, the insulating layers located on the conductive layers, top surfaces of the insulating layers are flush with a top surface of the substrate;
trimming the second gate structures in the second direction to form first gate structures; wherein
the forming trenches extending in a first direction and arranged in a second direction in the active area comprises:
forming a first mask pattern on the active area by self-aligned multiple patterning; wherein the first mask pattern comprises first windows extending in the first direction and arranged in the second direction; and
etching the active area based on the first windows, to form the trenches in the active area;
wherein the trimming the second gate structures in the second direction to form first gate structures comprises:
forming a second mask pattern on a surface of the base; wherein the second mask pattern comprises second windows extending in the second direction and arranged in the first direction; and etching isolation layers, conductive layers and insulating layers based on the second windows to form the first gate structures;
wherein in a memory comprising static random access memory cells, every two rows of the first gate structures and the first gate structures separated by two rows have same opening positions;

forming recessed channel array transistors based on the first gate structures; and forming the static random access memory cell with six transistors based on the recessed channel array transistors.

8. The static random access memory cell of claim 7, wherein the first gate structures comprise an isolation layer and a conductive layer formed on the isolation layer; wherein a surface of the conductive layer is lower than a surface of the substrate.

9. The static random access memory cell of claim 8, wherein the conductive layer comprises a metal layer and a polysilicon layer on the metal layer.

10. The static random access memory cell of claim 9, wherein the first gate structures further comprise an insulating layer located on the polysilicon layer; wherein a surface of the insulating layer is flush with the surface of the substrate.

11. The static random access memory cell of claim 10, wherein the metal layer is formed from tungsten, and the insulating layer is formed from silicon nitride.

12. The static random access memory cell of claim 8, wherein a thickness of the isolation layer and a dimension of the recessed channel array transistor satisfy a preset ratio relationship.

13. The static random access memory cell of claim 12, wherein the thickness of the isolation layer is 15 Å to 25 Å.

* * * * *